United States Patent [19]

Ishimaru et al.

[11] Patent Number: 4,969,556
[45] Date of Patent: Nov. 13, 1990

[54] VACUUM CONTAINER

[75] Inventors: Hajime Ishimaru, Tsukuba; Kazuo Miyamoto; Kyozi Ono, both of Iwatsuki; Yutaka Mikasa, Mishima; Hiroshi Takemura, Chofu, all of Japan

[73] Assignees: Hajime Ishimaru, Ibaragi; Mitsubishi Aluminum Kabushiki, Tokyo, both of Japan

[21] Appl. No.: 360,033

[22] Filed: Jun. 1, 1989

[30] Foreign Application Priority Data

| Jun. 6, 1988 | [JP] | Japan | 63-137379 |
| Aug. 25, 1988 | [JP] | Japan | 63-211321 |
| Aug. 25, 1988 | [JP] | Japan | 63-211322 |
| Aug. 25, 1988 | [JP] | Japan | 63-111544 |

[51] Int. Cl.$^5$ .................................................. B65D 81/20
[52] U.S. Cl. .................................. 206/524.8; 206/334
[58] Field of Search .................. 206/524.8, 334, 328

[56] References Cited

U.S. PATENT DOCUMENTS

| 1,713,558 | 5/1929 | Schollmeyer | 206/524.8 |
| 3,926,306 | 12/1975 | Van Nederveen | 206/524.8 |
| 4,117,875 | 10/1978 | Hickey | 206/524.8 |
| 4,243,349 | 1/1981 | Hickey et al. | 206/524.8 |

FOREIGN PATENT DOCUMENTS 0273791 7/1988 European Pat. Off. ............ 206/328

Primary Examiner—William I. Price

[57] ABSTRACT

Disclosed is a vacuum container for transporting one or more articles in the vacuum atomsphere. To this end, the vacuum container comprises a container body which can be maintained in the air-tight state and which is formed with a hole through which one or more articles are inserted into or removed out of said container body, a gate valve for opening or closing the opening of the container body, vacuum maintaining pump means communicated with the container body in order to maintain the interior thereof at an extremely high degree of vacuum and retaining means disposed within the container body for releasably retaining at least one article. With the vacuum container with the above-described construction, one or more articles which cannot be exposed to the surrounding atmosphere because of various reasons can be transported in the vacuum state in a stable manner.

5 Claims, 3 Drawing Sheets

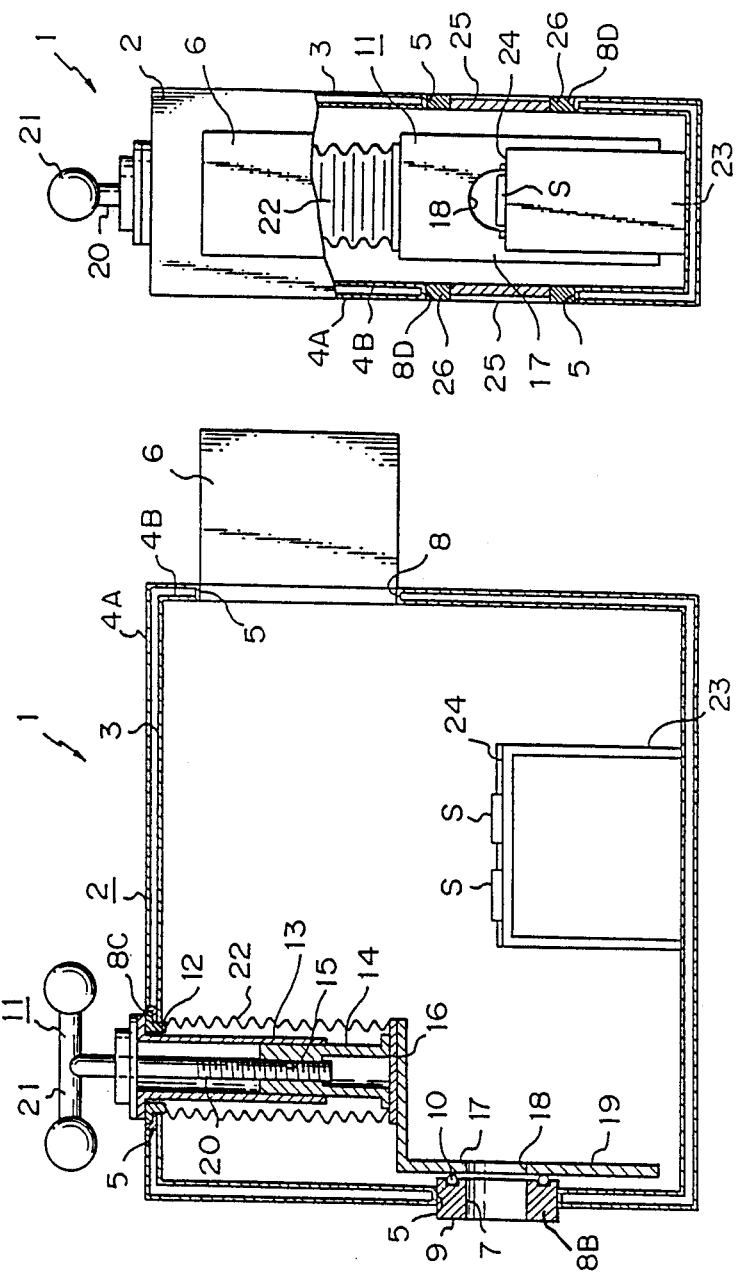

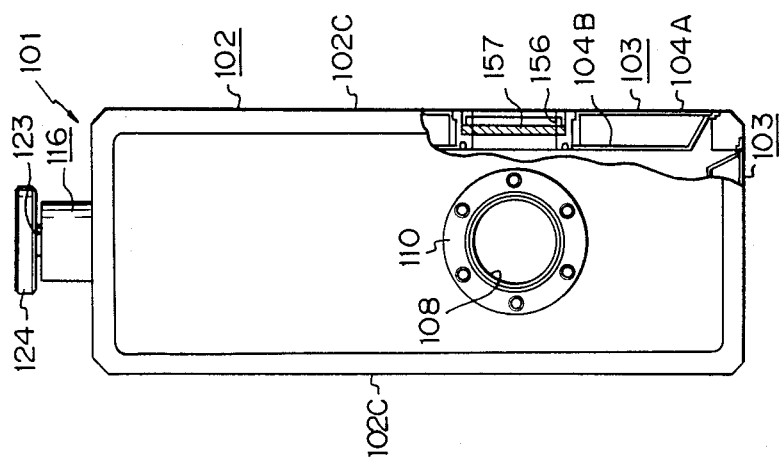
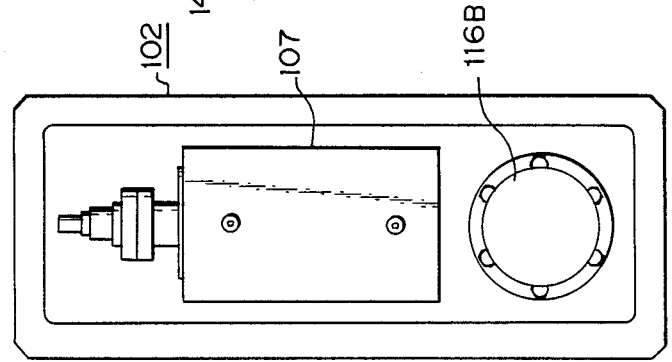

VACUUM CONTAINER

BACKGROUND OF THE INVENTION

1. Field of the Invention

The present invention relates to a vacuum container adapted to contain therein one or more articles in the vacuum state and more particularly a vacuum container adapted to transport one or more articles contained therein in the vacuum state.

2. Description of the Prior Art

In general, in the case of the production of semiconductor chips or the like, various substances which adhere over the surfaces of each chip and directly influence the quality thereof must be analyzed.

To this end, so far a sample of semiconductor chips fabricated in the vacuum atmosphere must be placed into an analyzer so as to analyze the substances attached over the surfaces of the sample. In addition to the semiconductor chips, some articles must be placed into an analyzer so as to analyze them in the vacuum atmosphere.

So far when the sample of semiconductor chips fabricated in the vacuum atmosphere is transported to an analyzer, it is contained in a simple closed container or the like for transportation.

However, when the sample is contained in such closed container or the like for transportation, it is exposed to the surrounding atmosphere so that various additional substances in the surrounding atmosphere further adhere to the surfaces of the sample being transported and contaminate them. As a result, the surface conditions of the sample become different from the original conditions of the surface of the sample fabricated so that there is a fear that the results of the analysis are erroneous.

Therefore, there has been devised and demonstrated a method in which a semiconductor chip fabrication apparatus is directly connected to an analyzer so that a sample of semiconductor chips fabricated can be directly transported to the analyzer without being exposed to the surrounding atmosphere.

However, the analyzers of the type used for such purpose are expensive and when such an expensive analyzer is bought and connected to a semiconductor chip fabrication apparatus, there is a fear that such method becomes unprofitable because of a low frequency in use.

Furthermore, in some analysis systems, semiconductor chips must be transported from one analyzer to another.

SUMMARY OF THE INVENTION

In view of the above, a first object of the present invention is to provide a vacuum container which can contain one or more articles such as semiconductor chips, which must not be exposed to the surrounding atmosphere, and transport them in the vacuum atmosphere.

A second object of the present invention is to provide a vacuum container which, in addition to the first object just described above, can eliminate or considerably shorten the baking processing of the interior of a container body required to maintain the interior thereof at an extremely high degree of vacuum.

A third object of the present invention is to provide a vacuum container which, in addition to the first and second objects described above, can be made light in weight so that when it is equipped with a handle or the like, the vacuum container can be transported.

The first object can be achieved by a vacuum container comprising a container body which is an air-tight structure and is formed with an opening through which one or more articles can be inserted into or removed out of the container body, a gate valve for opening or closing the opening of the container body, vacuum maintaining pump means communicating with the container body for maintaining the interior of the container body at an extremely high degree of vacuum and retaining means disposed within the container body for releasably retaining at least one article.

With the vacuum container with the above-described construction, the vacuum container and, for instance, a semiconductor device fabrication apparatus are intercommunicated with each other through an air-tight intermediate passage and then the gate valve opens the opening of the container body. Thereafter, an exterior vacuum pump such as a small-size turbo molecular pump which is communicated with the air-tight intermediate passage is driven to evacuate the air in the air-tight intermediate passage and the container body. After the air-tight intermediate passage and the container body are evacuated by the exterior pump at an extremely high degree of vacuum, a gate valve of the semiconductor device fabrication apparatus is opened so that it communicates through the air-tight intermediate passage with the container body of the vacuum chamber. Next, a manipulator, which is extended from the semiconductor device fabrication apparatus and is holding an article such as a semiconductor chip, is inserted through the air-tight intermediate passage into the container body, thereby transporting the article to the retaining means. After the article is placed on the retaining means, the manipulator is retracted out of the container body through the opening thereof and then the article is securely retained by the retaining means and the opening of the container body is closed by the gate valve. Thereafter, the vacuum-maintaining pump is driven so that the article is contained within the vacuum atmosphere. Next, the air-tight intermediate passage is disconnected from the container body and the vacuum chamber is transported to a predetermined place where the analyzers and other equipment are installed so that the article can be transported without being exposed to the surrounding atmosphere.

BRIEF DESCRIPTION OF THE ACCOMPANYING DRAWINGS

FIG. 1 is a front longitudinal sectional view of a first preferred embodiment of a vacuum container in accordance with the present invention;

FIG. 2 is a partial side longitudinal sectional view thereof;

FIG. 4 is a partial left-side longitudinal view of the first preferred embodiment shown in FIG. 1;

FIG. 5 is a right side view of FIG. 3; and

FIG. 6 is a cross sectional view of the first preferred embodiment shown in FIG. 1, illustrating major component parts thereof.

FIG. 7 shows a honey-comb structure usable in the invention.

DETAILED DESCRIPTION OF THE PREFERRED EMBODIMENTS

First Embodiment, FIGS. 1 and 2

Figure 3:
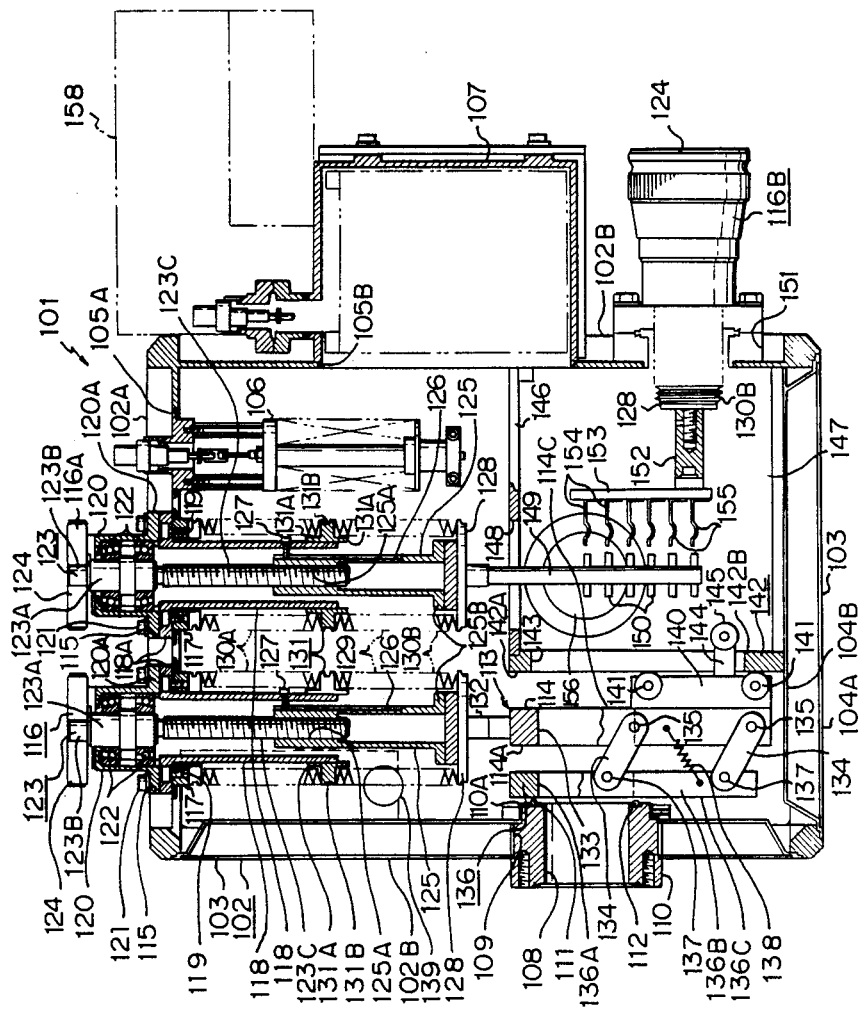
FIG. 3 is a front longitudinal sectional view of a second preferred embodiment of a vacuum container in accordance with the present invention.

FIGS. 1 and 2 illustrate a first preferred embodiment of a vacuum container 1 in accordance with the present invention. The vacuum container 1 has a container body 2 substantially in the form of a cube which consists of honey-comb sandwich panels 3 which are light in weight but have a high degree of strength. The honey-comb sandwich panel 3 is constructed by aluminum alloy plates 4A and 4B between which is interposed an aluminum alloy honey-comb structure (FIG. 7) joined to the plates 4A and 4B by vacuum braze welding. At the portions of the vacuum container 1 at which a vacuum maintaining pump 6 is mounted and an opening 8A is defined, frames 5 made of an aluminum alloy are joined to the plates 4A and 4B by vacuum braze welding in order to interconnect between the plates 4A and 4B in order to prevent the exposure of the honey-comb structure. The honey-comb structure may be in the form of a honey comb as its name implies, but it is to be understood that the structure between the plates 4A and 4B may be in the form of a grid, a corrugated structure or any other suitable structure.

Within an opening 8A of the container body 2 defined by the frames 5 is air-tightly mounted the vacuum maintaining pump 6 in such a way that a part of the pump 6 is extended out of the container main body. The vacuum maintaining pump 6 serves to maintain the interior of the container body 2 at an extremely high degree of vacuum (for instance, a maximum degree of vacuum of $10^{-10}$ Torr). For instance, an ion pump may be used as the vacuum maintaining pump 6, which is always driven when the interior of the container body 2 is maintained at an extremely high degree of vacuum.

In order to insert and remove articles such as samples S of semiconductor chips into and out of the container body 2, the opening 7 is defined in an opening frame 9 which in turn is hermetically installed in the opening 8B formed through the container body 2 and surrounded by the frames 5. A sealing member 10 is attached to the inner side of the opening frame 9 in such a way that the sealing member 10 surrounds the opening 7.

A gate valve 11 which opens or closes the opening 7 is supported in another opening 8 defined through the wall of the container body 2. The gate valve 11 has a ring-shaped mounting or retaining member 12 securely and air-tightly fitted into the opening 8C and a guide sleeve 13 has its upper end air-tightly fitted into the mounting member 12 and is extended downwardly into the container body 2. A movable sleeve 14 which is movable along the inner surface of the guide sleeve 13 is slidably fitted into the guide sleeve 13 and has an internally threaded center hole 15. A retaining member 16 is securely attached to the lower end of the movable sleeve 14 and a valve body 17 in the form of an L-shaped plate is securely attached to the retaining plate 16 in such a way that the vertical extended portion of the valve body 17 is located inwardly of the opening frame 9 and is pressed against the sealing member 10. The vertically extended portion of the valve body 17 has not only an intercommunicating opening 18 which may be aligned with the opening 7 but also a sealing plate portion 19 which is extended downward from the intercommunicating opening 18 and adapted to seal the opening 7.

A lead screw 20 has its upper end portion extended upwardly beyond the top surface of the container body 2 and is downwardly extended through the guide sleeve 13 and the internally threaded center hole 15 of the movable sleeve 14 is threadably engaged with the lead screw 20. A rotary handle 21 for rotating the lead screw 20 is securely attached to the upper end of the latter. As a result, when the rotary handle 21 is rotated, the lead screw 20 is also rotated so that the movable sleeve 14 can be vertically moved along the guide sleeve 13 and consequently the opening 7 can be opened through the intercommunicating opening 18 or closed by the sealing plate portion 19. The mounting member 12 and the retaining plate 16 are inserted into a bellows 22 which surrounds the guide sleeve 13 and the movable sleeve 14, thereby maintaining the air-tightness of the container body 2.

Within the container body 2 is disposed a stand 23 whose top plate 24 is a holding portion for holding thereon at least one sample S and is substantially in coplanar relationship with the center of the opening 7. Disposed also within the container body 2 is holding means (not shown) for releasably holding the sample S on the holding portion 24 in a stable manner. The container body 2 is formed with a pair of peep holes 25 each closed with a transparent window pane and supported by frames 26 air-tightly fitted into the openings 8D surrounded by the frames 5 so that it can be seen whether or not the sample S is held on the holding portion 24 of the stand 23. A handle (not shown) is extended upwardly from the container main body 2 so that the vacuum container 1 may be transported.

Next will be described the mode of operation of the first preferred embodiment with the above-described construction when the samples of the semiconductor chips fabricated in vacuum are transported.

First an intermediate air-tight passage (not shown) extended from an external vacuum pump (not shown) such as a small-size turbo molecular pump is not only connected to a semiconductor chip fabrication apparatus (not shown) with its one or more valves closed, but also connected to the opening frame 9. Next the rotary handle 21 is rotated to move the valve body downwardly in such a way that the opening 7 defined by the opening frame 9 is communicated with the intercommunicating opening 18 of the valve body 17. Thereafter the external vacuum pump is energized to evacuate the air from the intermediate air-tight passage and within the container body 2.

When the evacuation of the container body 2 by the external vacuum pump is accomplished so that the interior of the container body 2 is maintained at an extremely high degree of vacuum, the vacuum maintaining pump 6 is energized so that the interior of the container body 2 is maintained at an extremely high degree of vacuum of the order of approximately $10^{-10}$ Torr. Thereafter a gate of the semiconductor chip fabrication apparatus is opened so that the semiconductor chip fabrication apparatus and the container body 2 are intercommunicated through the intermediate air-tight passage. Next the sample S of the semiconductor devices fabricated by the semiconductor chip fabrication apparatus in vacuum is inserted by means of a manipulator from the semiconductor chip fabrication device into the container body 2 of the vacuum container 1 through the intermediate air-tight passage, the opening 7 and the intercommunicating opening 18 and then is placed on the holding portion 24 of the stand 23. When the sample S is placed on the stand 23, the manipulator is retracted out of the container body 2. Thereafter, the rotary handle 21 is rotated so as to move the valve body 17 upwardly so that the sealing plate portion 19 of the valve body 17 becomes in opposing relationship with the opening 7 and seals it. Thus, the interior of the container body 2 is maintained in the air-tight state. Meanwhile, the sample S placed on the stand 23 is maintained stationary and is prevented from falling off by holding means (not shown) even when the container body 2 is inclined. This state can be observed through one of the peep holes 25 of the container body 2.

Under these conditions, the sample S is housed in the container body 2 maintained at an extremely high degree of vacuum so that even when the vacuum container 1 is disconnected from the intermediate air-tight passage and is carried or transported, the sample S is not exposed to the surrounding atmosphere and can be transported to an analyzer.

As described above, according to the first preferred embodiment, the sample S can be housed within the container body 2, which is maintained at an extremely high degree of vacuum by the vacuum maintaining pump 6 and the gate valve 11, and can be transported so that the sample S can be shifted to an analyzer without being exposed to the surrounding atmosphere.

As described above, according to the first preferred embodiment of the present invention, the samples, which is housed within the container body 2 maintained at an extremely high degree of vacuum by the vacuum maintaining pump 6 and the gate valve 11, can be transported to an analyzer without being exposed to the surrounding atmosphere so that substances attached to the surfaces of a semiconductor chip can be analyzed without an error.

Furthermore, the container body 2 is constructed of an aluminum alloy so that an extremely high degree of vacuum can be maintained while eliminating or considerably shortening a time required for accomplishing the baking process for baking the inner surfaces. Such baking is essential in the case of a steel container body in order to maintain an extremely high degree of vacuum so that the fabrication process can be simplified and the fabrication costs can be decreased by using aluminum alloy.

Moreover, the container body 2 is constructed with the honey-comb sandwich panels 3 so that it can be made light in weight and its transportation is much facilitated.

In addition, the vacuum maintaining pump 6 and the gate valve 11 are incorporated in the container body 2 so that the latter constitutes some portions of the vacuum maintaining pump 6 and the gate valve 11 so that the container body 2 can be further made light in weight.

Second Embodiment, FIGS. 3 through 6

FIGS. 3-6 illustrate a second preferred embodiment of a vacuum container in accordance with the present invention in more detail than the first preferred embodiment described above with reference to FIGS. 1 and 2. As best shown in FIGS. 3 and 4, a vacuum container 101 has a container body 102 substantially in the form of a cube which consists of honey-comb sandwich panels 103 which are light in weight but have a high degree of strength. The honey-comb sandwich panel 103 is constructed of aluminum alloy plates 104A and 104B between which is interposed an aluminum alloy honey-comb structure (FIG. 7) made of the same material as the plates 104A and 104B and joined to them by vacuum braze welding.

The top wall 102A and the side wall 102B are formed with pump mounting holes 105A and 105B, respectively, into which are hermetically mounted a non-evaporable getter pump 106 and an ion pump 107 in order to maintain the interior of the container body 102 at an extremely high degree of vacuum of the order of approximately, for example, $10^{-10}$ Torr at the maximum. The non-evaporable getter pump 106 is disposed substantially within the container body 102 while the ion pump 107 is extended from the container body 102. Both the neg pump 106 and 107 are always driven when the interior of the container body 102 must be maintained at an extremely high degree of vacuum. An opening 108 through which a sample such as a sample of semiconductor chips is inserted into and removed out of the container body 102 is defined in a base 110 which in turn is air-tightly mounted in a base mounting opening 109 formed through the side wall 102B of the container body 102. An annular groove 111 is defined at the inner surface 110A of the base 110 so as to surround the opening 108, and a metal sealing member 112 is snugly fitted into the annular groove 111 in such a way that a part of the sealing member 112 is extended out of the annular groove 111 when viewed in cross section.

In order to open or close the opening 108, a gate valve 113 is disposed within the container body 102 and pushing means to be described in detail below of the gate valve 113 is supported by a linear introduction device 116 mounted in a mounting hole 115 formed through the top wall 102A of the container body 102. The linear introduction device 116 has an annular mounting or retaining member 117 fitted into the mounting hole 115 and the upper end flange 118A of a guide sleeve 118 extended downwardly within the container body 102 is securely joined to the inner surface of the retaining member 117 with a plurality of bolts 119. A bearing supporting or retaining member 120 coaxial with the guide sleeve 118 has its lower end flange 120A securely joined with a plurality of bolts 121 to the upper surface of the flange 118A of the guide sleeve 118. A plurality of bearings 122 are supported within the bearing retaining member 120 in such a way that they are spaced apart from each other vertically by a suitable distance and rotatably support an enlarged-portion 123A at the upper end of a lead screw 123 extended outwardly and inwardly of the container body 102. A rotary handle 124 is securely attached to a small-diameter portion 123B defined at the upper end of the lead screw 123 so that upon rotation of the rotary handle 124, the lead screw 123 is caused to rotate in unison with the rotary handle 124. About ⅔ of the length of the lead screw 123 starting from its lower end is externally threaded as indicated by 123C and is threadably engaged with an internally threaded portion 125A at the inner surface of the upper end portion of a movable sleeve 125. The movable sleeve 125 has a key groove 126 extended axially at the outer peripheral surface and a key 127 extended from the guide sleeve 118 is fitted into the key groove 126, thereby preventing the rotation of the movable sleeve 125. It follows therefore that the movable sleeve 125 is only permitted to linearly move in the axial direction thereof. It must be pointed out here that the rotation of the lead screw 123 may be made by using a motor (not shown).

The lower end of the movable sleeve 125 is terminated into a flange 125B to which is attached, with a plurality of bolts (not shown), a large-diameter retaining disk 128 which is equal in diameter to the retaining member 117. A cylindrical bellows structure 129 is interposed between the retaining members 117 and 128 in order to air-tightly divide the interior and exterior of the bellows structure 129. The bellows structure 129 comprises a first bellows 130A whose upper end is securely attached to the lower surface of the retaining member 117, a second bellows 130B whose lower end is connected to the upper surface of the retaining member 128 and a reinforcing sleeve 131 interconnecting between the first bellows 130A and the second bellows 130B. The reinforcing sleeve 131 comprises a sleeve body 131A whose inner surface is made into slidable contact with the outer peripheral surface of the guide sleeve 118 and a flange 131B integral with the outer peripheral surface of the sleeve body 131A and the first and second bellows 130A and 130B are connected to the upper and lower surfaces, respectively, of the flange 131B.

The pushing means 114 of the gate valve 113 is securely attached through a retaining rod 132 at the center of the lower surface of the retaining member 128 and is in the form of an elongated rectangular plate. The direction of the pushing means 114 is controlled so that its surface 114A is maintained in opposing relationship with the opening 108. An opening 133 substantially similar in configuration to the opening 108 is defined at the widthwise center portion of the upper portion of the pushing means 114. As best shown in FIG. 6, a plurality of links 134 equal in length have their both ends pivoted with pivot pins 135 to the vertical center portions and lower end portions of both of the side surfaces 114B of the pushing means 114. Each pivot pin 135 is extended in the widthwise direction of the pushing means 114 perpendicular to the path of the movement of the pushing means 114, and perpendicular to the extension direction of the opening 108 in the three-dimensional so that each link 134 is pivotably attached in the vertical direction.

Rotatably pivoted to the leading ends of the four links 134 with pivot pins 137 is a rectangular valve plate 136 which is equal in width to the pushing means 114 and is moved toward or away from the opening 108. The distance between a pair of pins 137 on one side of the valve plate 136 is equal to that between a pair of pins 135 on one side of the pushing means 114 so that the four links 134 constitute parallel link four-bar linkage. When the links 134 are rotated, the valve plate 136 is maintained in parallel with the pushing means 114 while each point of the valve plate 136 draws an arc to change the linear distance between the valve plate 136 and the pushing means 114 so that the valve plate 136 displaces itself relative to the pushing means 114.

A coiled spring 138, for normally biasing the valve plate 136 toward the pushing means 114 is loaded between the valve plate 136 and the pushing means 114 so that, as shown in FIG. 3, in its free state the upper end of the valve plate 136 is maintained in coplanar relationship with the upper end of the pushing means 114 in such way that, of the pins 135 and 137 which pivot both ends of each link 134 interposed between the pushing member 114 and the valve plate 136, the pin 137 on the side of the valve plate 136 is located at an upward position in the vertical direction. The valve plate 136 is formed with an opening 136A which is similar in configuration to those of the openings 108 and 133 and is aligned therewith in the free state described above. Formed below the opening 136A of the valve plate 136 is a sealing portion 136B having an area sufficient to contact with the whole periphery of the sealing member 112 disposed around the outer periphery of the opening 108 and the surface 136C of the sealing portion 136B in opposing relationship with the opening 108 is machined to become a mirror surface in order to enhance its sealability.

Within the container body 102, a stopper 139 is disposed so that when the pushing means 114 is lifted so that the sealing portion 136B of the valve plate 136 comes into completely opposing relationship with the opening 108 of the container body 102, the stopper 139 engages with the upper end of the valve plate 136, thereby preventing further lifting of the valve plate 136. It follows therefore that after the upper end of the valve plate 136 engages with the stopper 139, only the pushing member 114 is moved upwardly.

A rectangular supporting plate 140 is disposed in such a way that it is made to contact with the pushing means 114 at the lower portion of the rear surface 114 thereof and each side surface 40A of the supporting plate 140 has a pair of vertically-spaced-apart rotatable guide rollers 141. Within the container body 102, a guide plate 142 is vertically erected in parallel with and in the vicinity of the supporting plate 140 in such a way that the upper end of the guide plate 142 is substantially in coplanar relationship with the upper end of the base 110. The guide plate 142 is formed with a large center opening 143 which may contain the opening 108 if the latter be displaced to the center opening 143. The guide rollers 141 are rotatably made in contact with both of the sides of one surface 142A of the guide plate 142. As best shown in FIG. 6, a pair of brackets 144 are extended through the center opening 143 of the guide plate 142 and guide rollers 145 are extended from the brackets 144 which are made into rolling contact with the rear surface 142B of the guide plate 142 at the midpoint between the upper and lower guide rollers 141 of the supporting plate 140. Therefore the guide plate 142 is sandwiched by the guide rollers 141 and 145 which roll upon the surfaces of the guide plate 142 so that the pushing means 114 can correctly move linearly vertically.

A partition plate 146 which is extended within the container body 102 in the horizontal direction away from the opening 108 to the side wall 102B of the container body 102 is connected to the upper end of the guide plate 142 so that the container body 102, the guide plate 142 and the partition wall 146 defines an articles holding chamber 147. The partition wall 146 is formed with an opening 148.

A mounting hole 115 which mounts therein a linear introduction device 116A which is substantially similar in construction to the linear introduction device 116 described in detail hereinbefore is formed through the top wall 102A of the container body 102 immediately above the opening 148 of the partition plate 146. The linear introduction device 116A is extended downwardly into the container body 102 and its component parts are designated by the same reference numerals used to explain the construction of the linear introduction device 116. Therefore no explanation of the linear introduction device 116A shall be made in this specification. A supporting rod 149 whose upper end is securely attached to the lower surface of the retaining member 128 of the linear introduction device 116A is extended through the opening 148 of the partition wall 146 into the articles holding chamber 147. A plurality (six in the second embodiment) of goods holding shelves 150 are horizontally extended from each side surface of the supporting rod 149 and are vertically spaced apart from each other by a predetermined same distance. By driving the linear introduction device 116A, the supporting rod 149 is vertically moved so that each goods holding shelf 150 is aligned with the opening 108 of the container body 102.

The portion below the ion pump 107 of the side wall 102B of the container body 102 is formed with a mounting hole 151 into which is horizontally mounted a linear introduction device 116B which is substantially similar in construction to the above-described linear introduction devices 116 and 116A and which is adapted to cause the linear movement of a retaining plate 128. The component parts of the linear introduction device 116B are designated by the same reference numerals used in the description of the linear introduction devices 116 and 116A and no further explanation of the linear introduction device 116B shall be made in this specification.

A supporting rod 152 is extended from the retaining plate 128 of the linear introduction device 116B into the articles holding chamber 147 and a vertically extended supporting plate 153 is securely attached to the leading end of the supporting rod 152. A plurality of leaf springs 154 equal in number to the holding shelves 150 of the supporting rod 149 are extended from the supporting plate 153 in the direction toward the opening 108 of the container body 102 and are vertically spaced apart from each other by the same distance as the distance between the adjacent shelves 150. Each leaf spring 154 is disposed so as to be in contact with the upper surface of the corresponding shelf 150. Furthermore, each leaf spring 154 has an arcuate (downwardly concaved) holding portion 155 at its leading end portion.

Both the side walls 102C of the container body 102 are formed with a peep hole 156 each closed with a sheet of a transparent glass so that the samples in the articles holding chamber 147 can be visually observed. The ion pump 107 is energized by a motor 158.

Next the mode of operation of the second preferred embodiment with the above-described construction will be described when the samples of the semiconductor chips fabricated in a vacuum atmosphere are transported.

A semiconductor chip fabrication apparatus with one or more valves thereof closed and the opening 108 of the container body 102 of the vacuum chamber 101 are intercommunicated by an air-tight intermediate passage (not shown). Thereafter the rotary handle 124 of the linear introduction device 116A is rotated to rotate the lead screw 123 so that the movable sleeve 125 threadably engaged with the lead screw 123 is moved downwardly in unison with the retaining plate 128 and the supporting rod 149, thereby aligning the uppermost shelf 150 with the opening 108 of the container body 102. Meanwhile the rotary handle 124 of the linear introduction device 116 is rotated to rotate the lead screw 123 so that the valve plate 136 is caused to move downwardly in unison with the pushing means 114 so that the opening 136A of the valve plate 136 is aligned or communicated with the opening 108 of the container body 102. Thereafter the opening 108 is opened and then the non-evaporable getter pump 106 and the ion pump 107 are driven to evacuate the air in the air-tight interconnection passage and in the interior of the container body 102. It must be pointed here that as in the case of the first preferred embodiment, an exterior powerful vacuum pump may be used.

When the interior of the container body 102 is evacuated by the non-evaporable getter pump 106 and the ion pump 107 so that it is maintained at an extremely high degree of vacuum, the driving of the non-evaporable getter pump 106 and the ion pump 107 is continued in order to maintain the interior of the container body 102 at an extremely high degree of vacuum, for instance, approximately $10^{-10}$ Torr and then a gate of the semiconductor chip fabrication apparatus is opened so as to intercommunicate with the container body 102 through the air-tight intermediate passage. Thereafter a sample of the semiconductor chips fabricated by the semiconductor chip fabrication apparatus in a vacuum atmosphere is directly introduced by means of a manipulator from the vacuum atmosphere in the fabrication apparatus into the container body 102 through the air-tight intercommunication passage, the opening 108, the opening 136A of the valve plate 136, the opening 133 of the pushing means 114 and the center opening 143 of the guide plate 142 and then is placed on the uppermost shelf 150 in the articles holding chamber 147. After the sample is placed on the uppermost shelf 150, the manipulator is retracted out of the container body 102. Then the rotary handle 121 of the linear introduction device 116A is rotated in the opposite direction so that the movable sleeve 125 is moved upwardly together with the retaining plate 128, thereby aligning the second uppermost shelf 150 with the opening 108 of the container body 102. Next, the next sample is placed on the second uppermost shelf 150 in a manner substantially similar to that described above.

After the samples have been placed upon all the shelves 150 in the manner described above, the rotary handle 124 of the linear introduction device 116 is rotated to move the pushing means 114 upwardly. Then, the valve plate 136 which is supported by the parallel link four-bar linkage and is biased toward the pushing means 114 under the force of the coiled spring 138 is caused to move upwardly in unison with the pushing means 114 in the direction of the movement of the latter. In this case, the end on the side of the valve plate 136 of the same link 134 is higher than the end thereof on the side of the pushing means 114. After the pushing means 114 and the valve plate 136 have been shift over some distance in unison so that the sealing portion 136B of the valve plate 136 is aligned with the opening 108, the upper end of the valve plate 136 engages with the stopper 139 so that the further upward movement of the valve plate 136 is not permitted.

However, when the pushing means 114 is further moved upwardly, the links 134 of the parallel link four-bar linkage supporting the valve plate 136 in engagement with the stopper 139 are rotated about the pivot pins 137 attached to the valve plate 136 in the counter-clockwise direction so that the links 134 extend horizontally. In this case, the pushing means 114 is so designed and constructed only to correctly vertically move by means of the guide rollers 145 disposed so as to sandwich the partition wall. As a result, upon rotation of the links 134, the valve plate 136 is caused to move horizontally toward the opening 108 against the force of the coiled spring 138 away from the pushing means 114 so that the sealing portion 136B of the valve plate 136 is pressed against the sealing member 112 supported around the outer periphery of the opening 108, thereby completely sealing the opening 108.

Meanwhile, in order to securely hold the samples placed on the shelves 150, first the rotary handle 124 of the linear introduction device 116A is rotated to lower the supporting rod 149 so that each of the samples on the shelves 150 may be located slightly below the corresponding leaf spring 154 of the linear introduction device 116B in the vertical direction. Thereafter, the rotary handle of the linear introduction device 116B is rotated so as to move the supporting rod 152 toward the supporting rod 149. When each leaf spring 154 is located immediately above the sample placed on the corresponding shelf 150. Thereafter the supporting rod 152 is stopped. The rotary handle 124 of the linear introduction device 116A is rotated in the opposite direction so as to slightly move the supporting rod 149 upwardly and the upward movement of the supporting rod 149 is stopped when the holding or retaining portion 155 of each leaf spring 154 is pressed against the sample placed on the corresponding shelf 150. Then each leaf spring 154 presses each sample placed on each shelf 150 so that even when the container body 102 is inclined, the samples can be prevented from falling off from the shelves 150. This is confirmed visually through the peep hole 156.

Under the above-described conditions, the samples are housed in an extremely high degree of vacuum within the container body 102 so that after the air-tight intermediate passage is disconnected from the vacuum chamber 101, the latter can be transported to an analyzer without exposing the samples in the vacuum container 101 to the surrounding atmosphere.

In order to move the sealing portion 136b of the valve plate 136 away from the sealing member 112 surrounding the opening 108 of the container body 102, first the rotary handle 124 of the linear introduction device 116 is rotated while the valve plate 136 is sealing the opening 108, so as to move the pushing means 114 downwardly. Then even when the pushing means 114 is moving downwardly, the valve plate 136 whose upper end is in engagement with the stopper 139 is interposed between the opening 108 and the pushing means 114 and continues its engagement with the stopper 139 for a while under the force of the coiled spring 138 which normally biases the valve plate 136 upwardly. During the above-described step, the links 134 of the parallel link four-bar linkage are rotated about the pivot pins 137 on the side of the valve plate 136 in the clockwise direction so that the valve plate 136 is moved toward the pushing means 114; that is, the valve plate 136 is moved away from the sealing member 112 surrounding the opening 108. Thereafter the valve plate 136 is moved downwardly in unison with the pushing means 114 so that the opening 133 of the pushing means 114, the opening 136A of the valve plate 136 and the opening 108 of the container body 102 are aligned with each other.

As described above, according to the second preferred embodiment of the present invention, the samples can be housed within the container body 102 which is maintained at an extremely high degree of vacuum by the non-evaporable getter pump 106, the ion pump 107 and the gate valve 113 and can be transported to an analyzer without exposing the samples to the surrounding atmosphere so that substances attached to the surfaces of the samples of the semiconductor chips can be analyzed with a high degree of accuracy or without any analytical errors.

The valve plate 136 is vertically moved in the direction perpendicular to a line perpendicularly extended from the opening 108 and is moved toward or away from the opening 108, thereby closing or opening the opening 108. When the valve plate 136 is closing the opening 108, the links 134 of the parallel link four-bar linkage are maintained in the horizontal direction so that the pushing means 114 causes the valve plate 136 to press against the sealing member 112 so that the interior of the container body 102 can be maintained at an extremely high degree of vacuum by the gate valve 113.

Furthermore, in each of the linear introduction devices 116, 116A and 116B (to be designated only by the reference numeral 116 hereinafter), the bellows structure 29 which defines the interior and the exterior of the linear introduction device 116, has the reinforcing sleeve 131 which is interconnected between the first and second bellows 130A and 130B and whose inner surface is made into slidable contact with the outer peripheral surface of the guide sleeve 118. As a result, unlike the conventional use of the prior art bellows in which the pressure outside of the bellows is higher than the pressure inside thereof, even when the pressure inside of the bellows structure is higher than the pressure outside thereof, the outward flexion of the first and second bellows 130A and 130B can be prevented so that the boundary between the outside and the inside of the bellows structure can be defined in a stable manner.

In addition, the samples placed on the shelves 150 supported by the supporting rod 149 which is vertically moved by the linear introduction device 116A, are elastically pressed and held by the leaf springs 154 by operating the linear introduction devices 116A and 116B so that even when the vacuum container 101 is inclined the samples can be held in a stable manner on the shelves 150.

It is to be understood that the present invention is not limited to the first and second embodiments thereof described in detail above with reference to the accompanying drawings and that various modifications can be effected as needs demand.

What is claimed is:

1. A vacuum container comprising
   a container body which can be maintained in the air-tight state and is formed with an opening through which articles can be inserted into or removed out of said container body;
   a gate valve for opening or closing said opening of said container body;
   vacuum pump means communicated with said container body for maintaining the interior of said container body at an extremely high degree of vacuum; and
   retaining means which is disposed within said container body in order to releasably hold and retain at least one article.

2. A vacuum container as set forth in claim 1, wherein said container body is made of aluminum.

3. A vacuum container as set forth in claim 1 or 2, wherein at least one portion of said container body has a honey-comb structure.

4. A vacuum container as set forth in claim 1 or 2, wherein said gate valve comprises
   pushing means which is reciprocably movable in a direction perpendicular to a line perpendicularly extended from said opening;

driving means for reciprocating said pushing means;
a parallel linkage consisting of a plurality of links each of which is pivotably attached to said pushing means with a pin extended in the direction perpendicular to the direction of the movement of said pushing means and extended in a direction perpendicular to the extension direction of said opening;
a valve plate which is supported by said parallel linkage and has a shape capable of closing said opening; and
stopper means which engages with said valve plate being displaced in one direction of said pushing means movement so as to restrict the displacement in said direction of said valve plate and thereafter, in response to the movement in said direction of said pushing means, causes said valve plate to move away from said pushing means by rotation of each of links of said parallel linkage, thereby forcing said valve plate to be pressed against wall surfaces surrounding said opening.

5. A vacuum container as set forth in claim 3, wherein said gate valve comprises pushing means which is reciprocally movable in a direction perpendicular to a line perpendicularly extended from said opening;
driving means for reciprocating said pushing means;
a parallel linkage consisting of a plurality of links each of which is pivotably attached to said pushing means with a pin extended in the direction perpendicular to the direction of the movement of said pushing means and extended in a direction perpendicular to the extension direction of said opening;
a valve plate which is supported by said parallel linkage and has a shape capable of closing said opening; and
stopper means which engages with said valve plate being displaced in one direction of said pushing means movement so as to restrict the displacement in said direction of said valve plate and thereafter, in response to the movement in said direction of said pushing means, causes said valve plate to move away from said pushing means by rotation of each of links of said parallel linkage, thereby forcing said valve plate to be pressed against wall surfaces surrounding said opening.

* * * * *